(12) United States Patent
Li et al.

(10) Patent No.: US 12,512,340 B2
(45) Date of Patent: Dec. 30, 2025

(54) MICRO DEVICE MASS TRANSFER EQUIPMENT

(71) Applicant: PlayNitride Display Co., Ltd., MiaoLi County (TW)

(72) Inventors: Yun-Li Li, MiaoLi County (TW); Yu-Hung Lai, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 668 days.

(21) Appl. No.: 17/876,534

(22) Filed: Jul. 29, 2022

(65) Prior Publication Data
US 2023/0036894 A1 Feb. 2, 2023

(30) Foreign Application Priority Data

Aug. 2, 2021 (TW) .................................. 110128286
Jun. 1, 2022 (TW) .................................. 111120381

(51) Int. Cl.
*B23P 19/00* (2006.01)
*H01L 21/67* (2006.01)
(Continued)

(52) U.S. Cl.
CPC .. *H01L 21/67144* (2013.01); *H01L 21/67092* (2013.01); *H01L 21/67103* (2013.01);
(Continued)

(58) Field of Classification Search
CPC ......... H01L 21/67092; H01L 21/67103; H01L 21/67132; H01L 21/67144; H01L 21/6835;
(Continued)

(56) References Cited

U.S. PATENT DOCUMENTS 8,721,803 B2 * 5/2014 Nagasaka ........... G03F 7/70925
134/36
12,057,330 B2 * 8/2024 Li .......................... H01L 25/13
(Continued)

FOREIGN PATENT DOCUMENTS

CN 104024835 9/2014
CN 109256350 1/2019
(Continued)

OTHER PUBLICATIONS

"Notice of allowance of China Counterpart Application", issued on Jul. 11, 2024, p. 1-p. 4.
(Continued)

*Primary Examiner* — Paul D Kim
(74) *Attorney, Agent, or Firm* — JCIPRNET

(57) ABSTRACT

A micro device mass transfer equipment including a base stage, a moving stage, a substrate stage, a laser device, a rolling and pressing mechanism, and a heating mechanism is provided. The moving stage is movably disposed on the base stage, and moves with a moving path. The substrate stage is movably disposed on the base stage, and is adapted to move between different positions overlapping the moving stage. The laser device is movably disposed on the base stage. The laser device is adapted to move relative to the substrate stage, and emits a laser beam toward the substrate stage. The rolling and pressing mechanism is disposed on the moving path of the moving stage, and forms a contact region with the moving stage. The heating mechanism is disposed corresponding to the contact region, and is adapted to heat the contact region between the moving stage and the rolling and pressing mechanism.

12 Claims, 15 Drawing Sheets

(51) Int. Cl.
  *H05K 13/04* (2006.01)
  *H01L 21/683* (2006.01)
  *H01L 25/075* (2006.01)
  *H10H 20/01* (2025.01)

(52) U.S. Cl.
  CPC ...... *H01L 21/6835* (2013.01); *H01L 25/0753* (2013.01); *H01L 2221/68381* (2013.01); *H10H 20/018* (2025.01)

(58) Field of Classification Search
  CPC . H01L 2221/68354; H01L 2221/68381; H01L 25/0753; H10H 20/01; H10H 20/018
  See application file for complete search history.

(56) References Cited

U.S. PATENT DOCUMENTS

| | | | |
|---|---|---|---|
| 2004/0228964 | A1 | 11/2004 | Ito et al. |
| 2014/0306192 | A1 | 10/2014 | Han |
| 2020/0006661 | A1 | 1/2020 | Shinokawa et al. |
| 2020/0357779 | A1 | 11/2020 | Kwag et al. |
| 2022/0001494 | A1 | 1/2022 | Sakamoto et al. |

FOREIGN PATENT DOCUMENTS

| | | |
|---|---|---|
| CN | 109524512 | 3/2019 |
| CN | 209087901 | 7/2019 |
| CN | 110416148 | 11/2019 |
| CN | 112599462 | 4/2021 |
| CN | 113594308 | 11/2021 |
| JP | 2001035816 | 2/2001 |
| JP | 2012192427 | 10/2012 |
| JP | 2019522891 | 8/2019 |
| JP | 2020042116 | 3/2020 |
| JP | 2020069530 | 5/2020 |
| KR | 20210040210 | 4/2021 |
| TW | 200400630 | 1/2004 |
| TW | 200415128 | 8/2004 |
| TW | 201822589 | 6/2018 |
| TW | M563718 | 7/2018 |
| TW | 201909379 | 3/2019 |
| TW | 202008558 | 2/2020 |
| TW | 202036927 | 10/2020 |
| WO | 2020188780 | 9/2020 |

OTHER PUBLICATIONS

"Office Action of Korea Related Application No. 10-2022-0093863", issued on May 17, 2024, with English translation thereof, pp. 1-9.

"Office Action of China Counterpart Application", issued on Sep. 13, 2024, p. 1-p. 10.

"Office Action of Taiwan Counterpart Application", issued on May 30, 2023, p. 1-p. 8.

"Notice of allowance of Taiwan Counterpart Application", issued on Dec. 25, 2023, p. 1-p. 3.

"Office Action of China Related Application, Application No. 202110883029.9", issued on Jan. 10, 2024, p. 1-p. 9.

"Office Action of China Counterpart Application", issued on Aug. 1, 2025, p. 1-p. 5.

* cited by examiner

MICRO DEVICE MASS TRANSFER EQUIPMENT

CROSS-REFERENCE TO RELATED APPLICATION

This application claims the priority benefit of Taiwan application serial no. 110128286, filed on Aug. 2, 2021, and Taiwan application serial no. 111120381, filed on Jun. 1, 2022. The entirety of each of the above-mentioned patent applications is hereby incorporated by reference herein and made a part of this specification.

BACKGROUND

Technical Field

The disclosure relates to a micro device mass transfer technology, and in particular relates to a micro device mass transfer equipment and method of fabricating micro device panel.

Description of Related Art

In addition to the advantages of low power consumption and long material lifespan, micro light-emitting diode displays also have excellent optical performance, such as high color saturation, fast response speed, and high contrast. In order to obtain lower production cost and larger product design margin, the fabricating technology of the micro light-emitting diode display adopts the method of die transfer. For example: a mass transfer technology that directly transfers the pre-fabricated micro light-emitting diode die to the backplane of a driving circuit. Specifically, the die manufacturer fabricates (or places) the micro light-emitting diode dies required by the customer on the temporary storage substrate, and then the customer transfers the micro light-emitting diode dies stored on the temporary storage substrate to the driving circuit boards of different products according to different application requirements.

Since the process time required for die transfer and bonding is not the same, the slower processing steps often become the bottleneck of the process and affect the overall throughput. In addition, most of the general bonding steps adopt a method of whole-surface heating, which is likely to affect the operational and electrical properties of the non-bonding region (e.g., the already-bonded region).

SUMMARY

The disclosure provides a micro device mass transfer equipment, which may provide micro devices with better bonding yield, and take into account both productivity and transfer accuracy.

The disclosure provides a method of fabricating a micro device panel, in which the transfer process and the bonding process of the micro device have better continuity.

The micro device mass transfer equipment of the disclosure includes a base stage, a moving stage, a substrate stage, a laser device, a rolling and pressing mechanism, and a heating mechanism. The moving stage is movably disposed on the base stage, and moves with a moving path. The substrate stage is movably disposed on the base stage and is adapted to move between different positions overlapping the moving stage. The laser device is movably disposed on the base stage. The laser device is adapted to move relative to the substrate stage and emits a laser beam toward the substrate stage. The rolling and pressing mechanism is disposed on the moving path of the moving stage, and forms a contact region with the moving stage. The heating mechanism is disposed corresponding to the contact region, and is adapted to heat the contact region between the moving stage and the rolling and pressing mechanism.

In an embodiment of the disclosure, the moving stage of the micro device mass transfer equipment is adapted to move along a first direction or a second direction, parallel to the base stage. The substrate stage is adapted to move along a third direction, and the first direction, the second direction, and the third direction are perpendicular to one another.

In an embodiment of the disclosure, while the moving stage of the micro device mass transfer equipment moves along the first direction, the laser beam moves along the second direction.

In an embodiment of the disclosure, while the laser beam of the micro device mass transfer equipment moves along the second direction, the substrate stage moves along the second direction.

In an embodiment of the disclosure, the moving stage of the micro device mass transfer equipment is adapted to pass through the substrate stage at a first speed, and is adapted to pass through the rolling and pressing mechanism at a second speed. The first speed is greater than or equal to the second speed.

In an embodiment of the disclosure, the rolling and pressing mechanism of the micro device mass transfer equipment includes a roller.

In an embodiment of the disclosure, the rolling and pressing mechanism of the micro device mass transfer equipment further includes a buffer layer disposed on the roller.

In an embodiment of the disclosure, the buffer layer of the micro device mass transfer equipment is multiple buffer bumps separated from one another.

In an embodiment of the disclosure, the roller of the micro device mass transfer equipment has a roundness, each of the buffer bumps has a thickness, and the roundness is less than the thickness of the buffer bump.

In an embodiment of the disclosure, the heating mechanism of the micro device mass transfer equipment includes a laser light source, which is disposed in the base stage and is located on a side of the moving stage facing away from the rolling and pressing mechanism, and is adapted to irradiate the contact region with another laser beam to heat the contact region. A light transmittance of the moving stage to the another laser beam is greater than 90%.

In an embodiment of the disclosure, the micro device mass transfer equipment further includes multiple the base stages, multiple the substrate stages, and multiple the rolling and pressing mechanisms. Each of the base stages is provided with one of the substrate stages or one of the rolling and pressing mechanism. The moving path of the moving stage extends between the base stages.

In an embodiment of the disclosure, the heating mechanism of the micro device mass transfer equipment includes multiple heating units, and the heating units are dispersedly disposed on a circumferential surface of the rolling and pressing mechanism.

The method of fabricating the micro device panel of the disclosure includes the following process. A target substrate is disposed on a moving stage. At least one micro device substrate is disposed on a substrate stage. The at least one micro device on the at least one micro device substrate is irradiated using a laser device, such that the at least one micro device is detached from the at least one micro device substrate and transferred to the target substrate. The moving stage is moved, such that the target substrate having the at least one micro device passes through a rolling and pressing mechanism. The contact region is heated, such that the at least one micro device is electrically bonded to the target substrate. The moving stage is adapted to drive the target substrate to move relative to a base stage. The substrate stage is adapted to drive the at least one micro device substrate to move close to or away from the base stage. The at least one micro device substrate has a substrate and at least one micro device. The at least one micro device is disposed on a surface of the substrate facing the target substrate. When the target substrate passes through the rolling and pressing mechanism, each of the at least one micro device has a contact region with the rolling and pressing mechanism.

In an embodiment of the disclosure, the target substrate of the method of fabricating the micro device panel is adapted to move relative to the base stage along a first direction or a second direction. The at least one micro device substrate is adapted to move along a third direction. The first direction, the second direction, and the third direction are perpendicular to one another. The at least one micro device of the at least one micro device substrate is multiple micro devices. The micro devices are arranged on the substrate along the first direction with a first pitch. After the micro devices are detached from the substrate and transferred to the target substrate, the micro devices are arranged on the target substrate along the first direction with a second pitch, and the second pitch is greater than the first pitch.

In an embodiment of the disclosure, in the method of fabricating the micro device panel, the moving stage moves at a first speed during a process of detaching the at least one micro device from the at least one micro device substrate. The moving stage moves at a second speed during a process of the target substrate having the at least one micro device passing through the rolling and pressing mechanism, and the first speed is greater than or equal to the second speed.

In an embodiment of the disclosure, the rolling and pressing mechanism of the method of fabricating the micro device panel includes a roller and a buffer layer disposed on the roller, and during a process of rolling and pressing the at least one micro device with the roller, the buffer layer is in contact with the at least one micro device.

In an embodiment of the disclosure, the buffer layer of the method of fabricating the micro device panel is multiple buffer bumps separated from one another.

In an embodiment of the disclosure, a width of any of the buffer bumps in the method of fabricating the micro device panel is less than a width of each of the at least one micro device.

In an embodiment of the disclosure, a process of heating the contact region of the method of fabricating the micro device panel includes heating the roller.

Based on the above, in the micro device mass transfer equipment and the method of fabricating the micro device panel according to an embodiment of the disclosure, after the micro devices are transferred to the target substrate, the micro devices should be further rolled and pressed by the rolling and pressing mechanism, and the micro devices may be firmly bonded to the target substrate after the contact region of the micro devices and the rolling and pressing mechanism has been heated. Since the transfer process and bonding process of micro devices are carried out in stages, in addition to improving the smoothness of the transfer process and bonding process of micro devices, it may also prevent the bonded micro devices from being damaged by the influence of unexpected heat flow during the bonding process of other micro devices.

DETAILED DESCRIPTION OF DISCLOSED EMBODIMENTS

Figure 1:
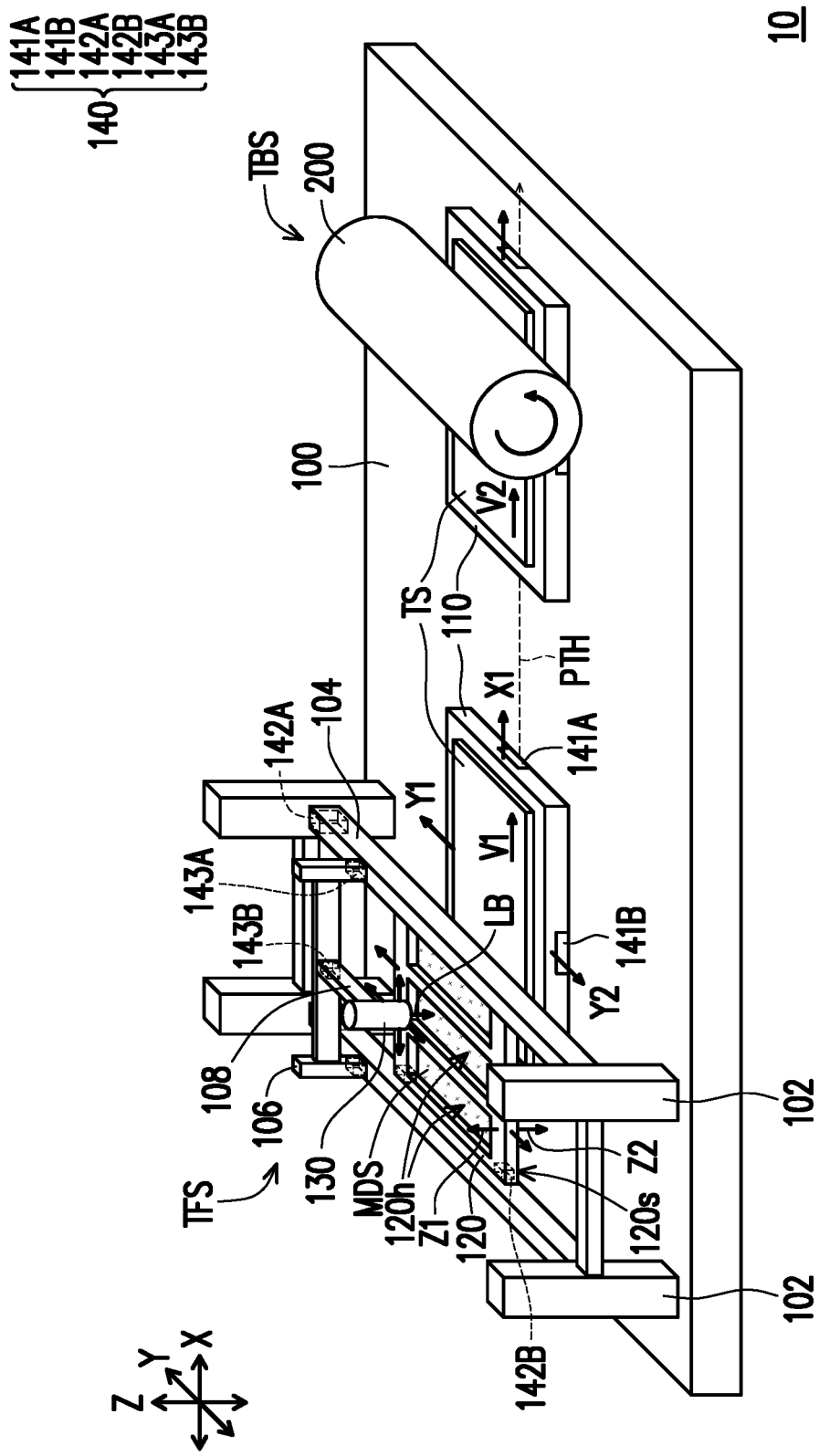
FIG. 1 is a schematic diagram of a micro device mass transfer equipment according to a first embodiment of the disclosure.
Figure 3:
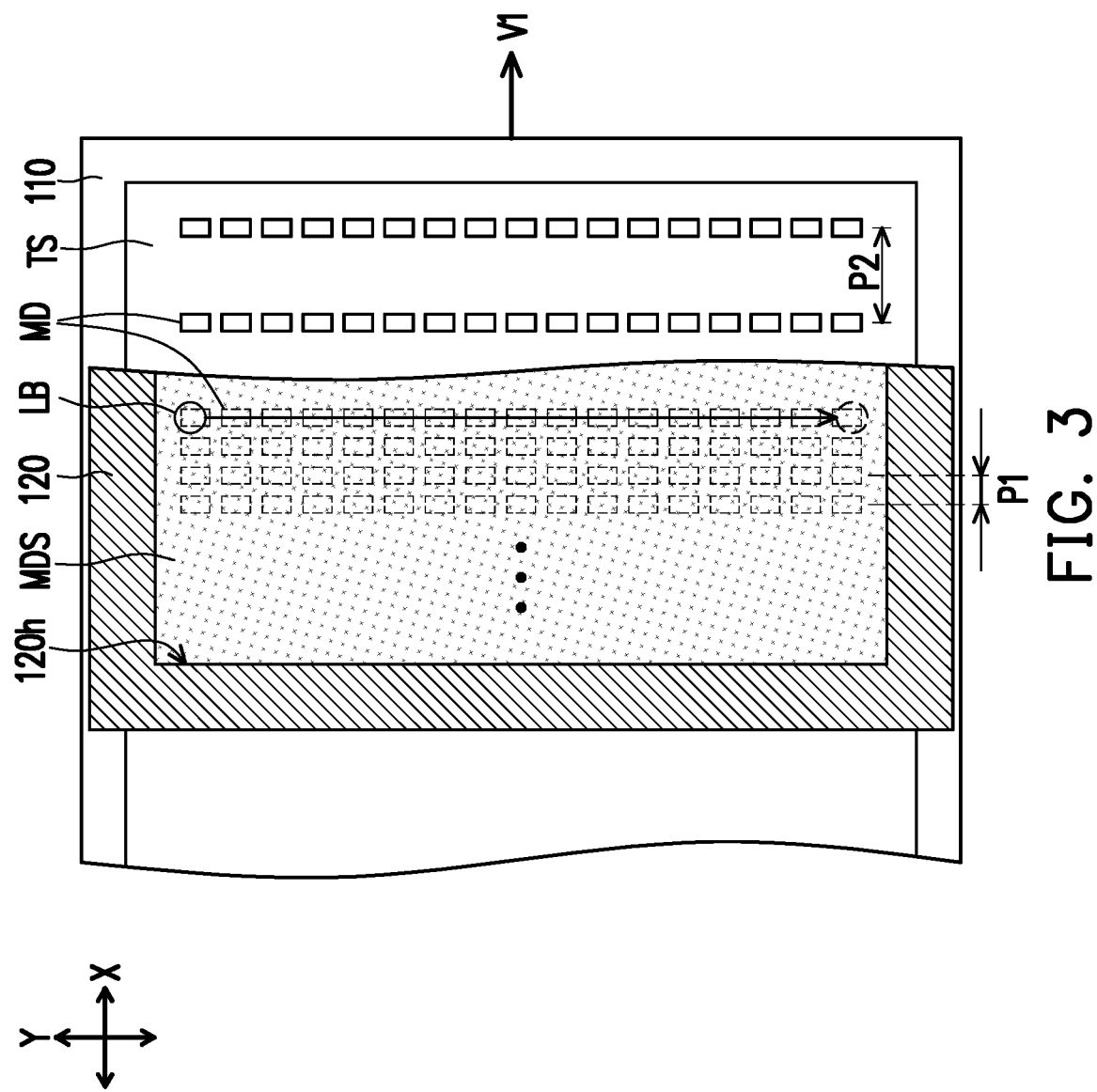
FIG. 3 is a top schematic diagram of when the micro device mass transfer equipment of FIG. 1 is used to perform a micro device transfer process.
Figure 4:
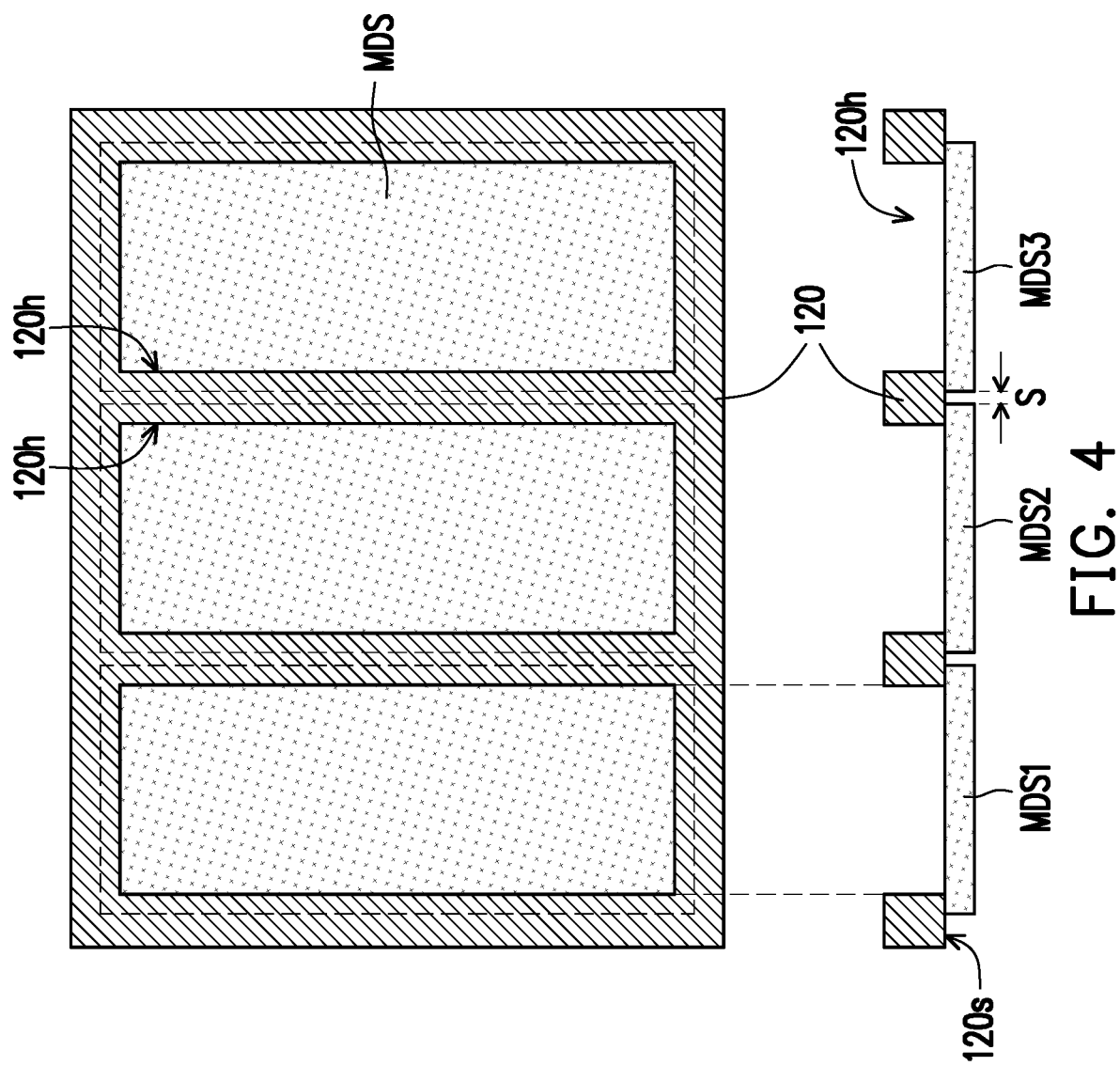
FIG. 4 is a schematic diagram of the substrate stage and the micro device substrate of FIG. 1 from different viewing angles.
Figure 5:
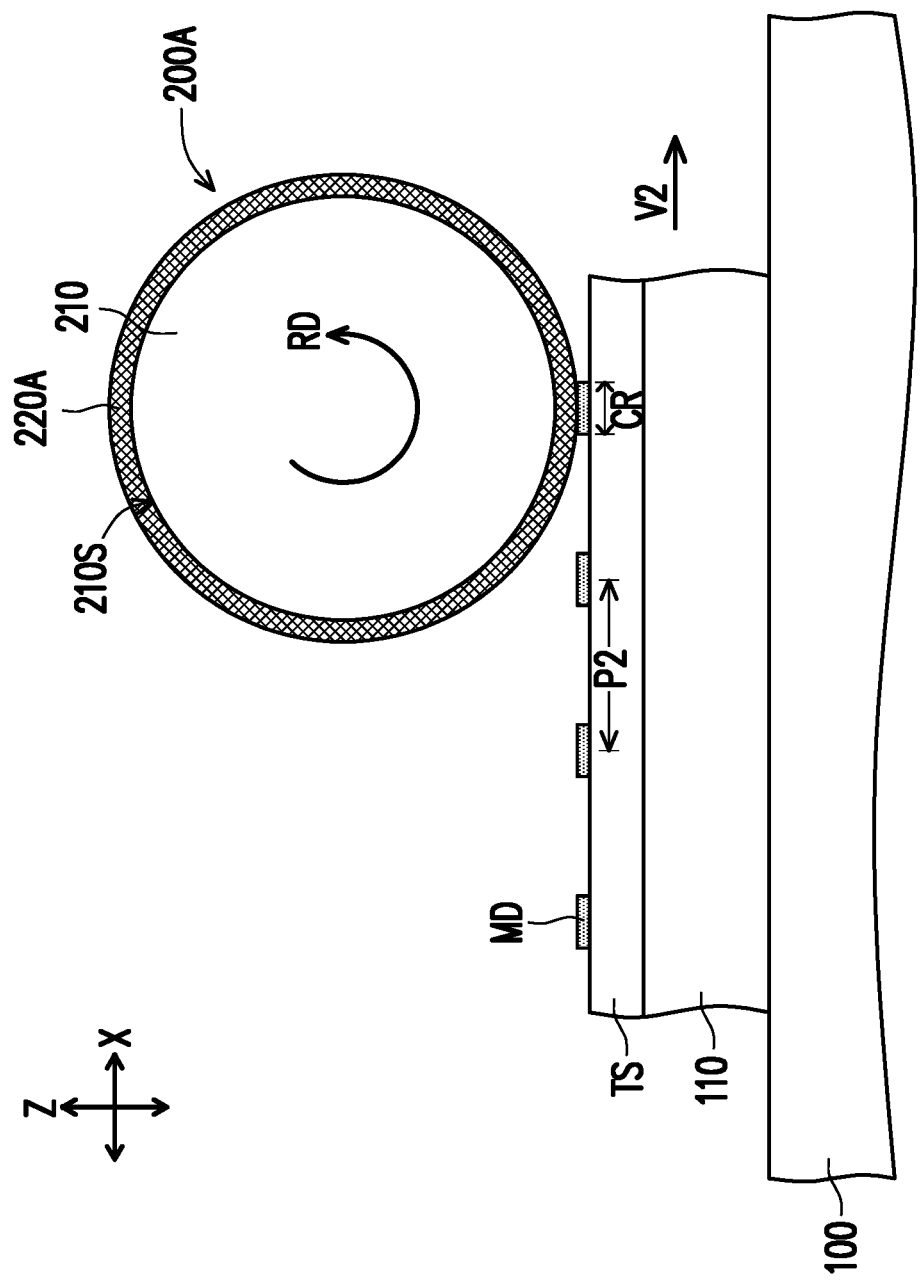
FIG. 5 to FIG. 7 are cross-sectional schematic diagrams of other modified embodiments of the micro device mass transfer equipment of FIG. 1.
Figure 6:
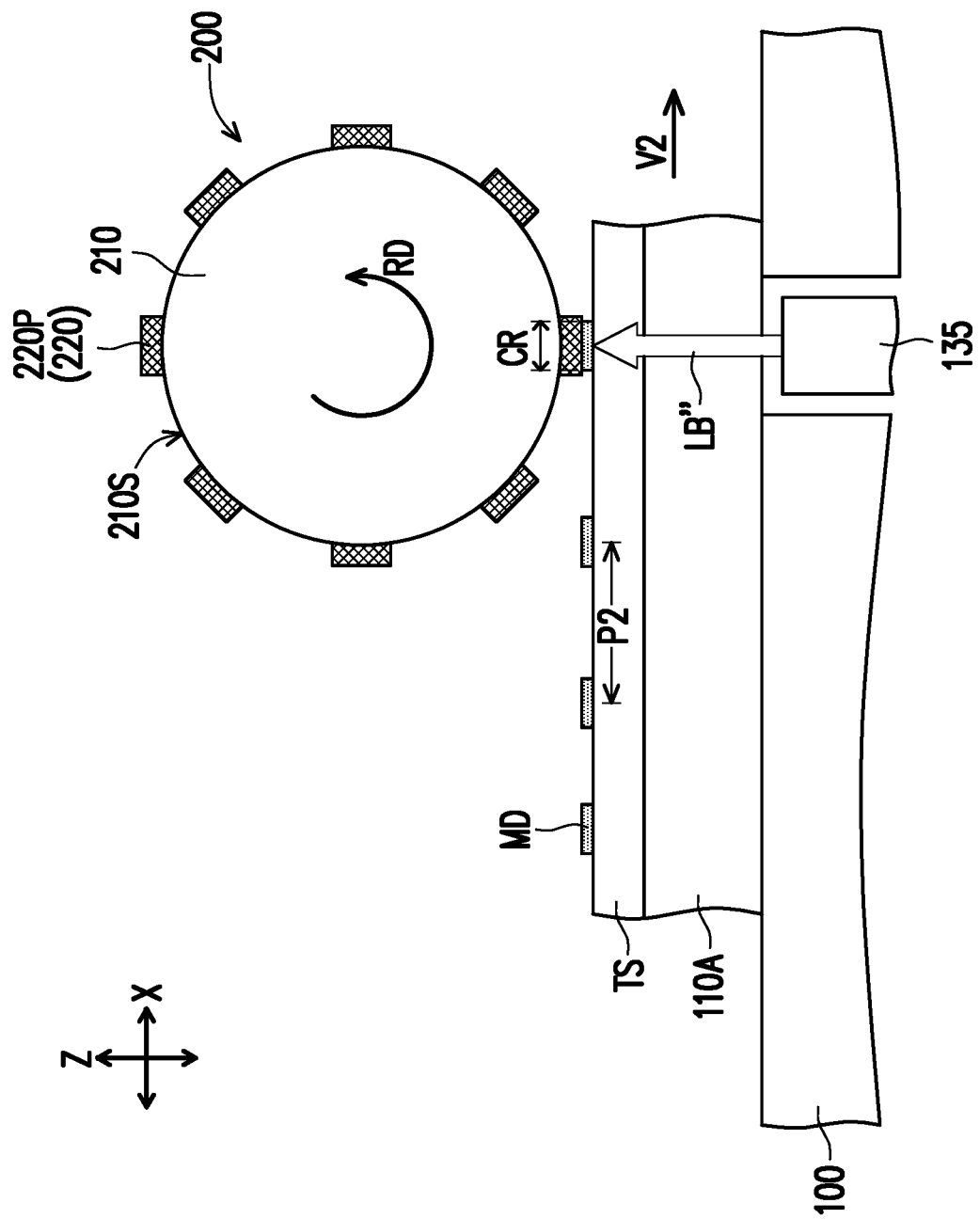
Figure 7:
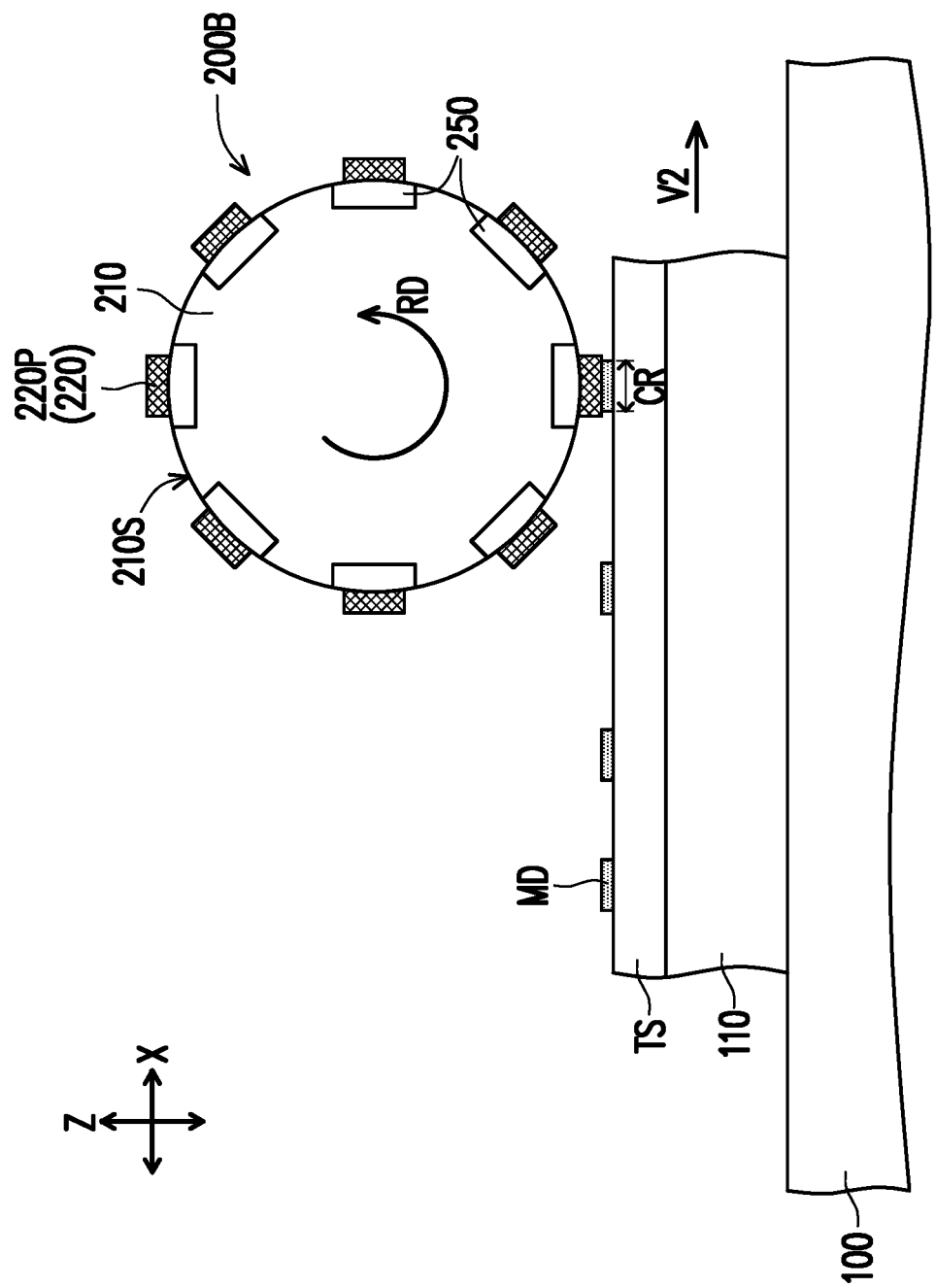

FIG. 1 is a schematic diagram of a micro device mass transfer equipment according to a first embodiment of the disclosure. FIG. 2A to FIG. 2G are schematic flowcharts of transposing micro devices using the micro device mass transfer equipment of FIG. 1. FIG. 3 is a top schematic diagram of when the micro device mass transfer equipment of FIG. 1 is used to perform a micro device transfer process. FIG. 4 is a schematic diagram of the substrate stage and the micro device substrate of FIG. 1 from different viewing angles. FIG. 5 to FIG. 7 are cross-sectional schematic diagrams of other modified embodiments of the micro device mass transfer equipment of FIG. 1.

Figure 2A:
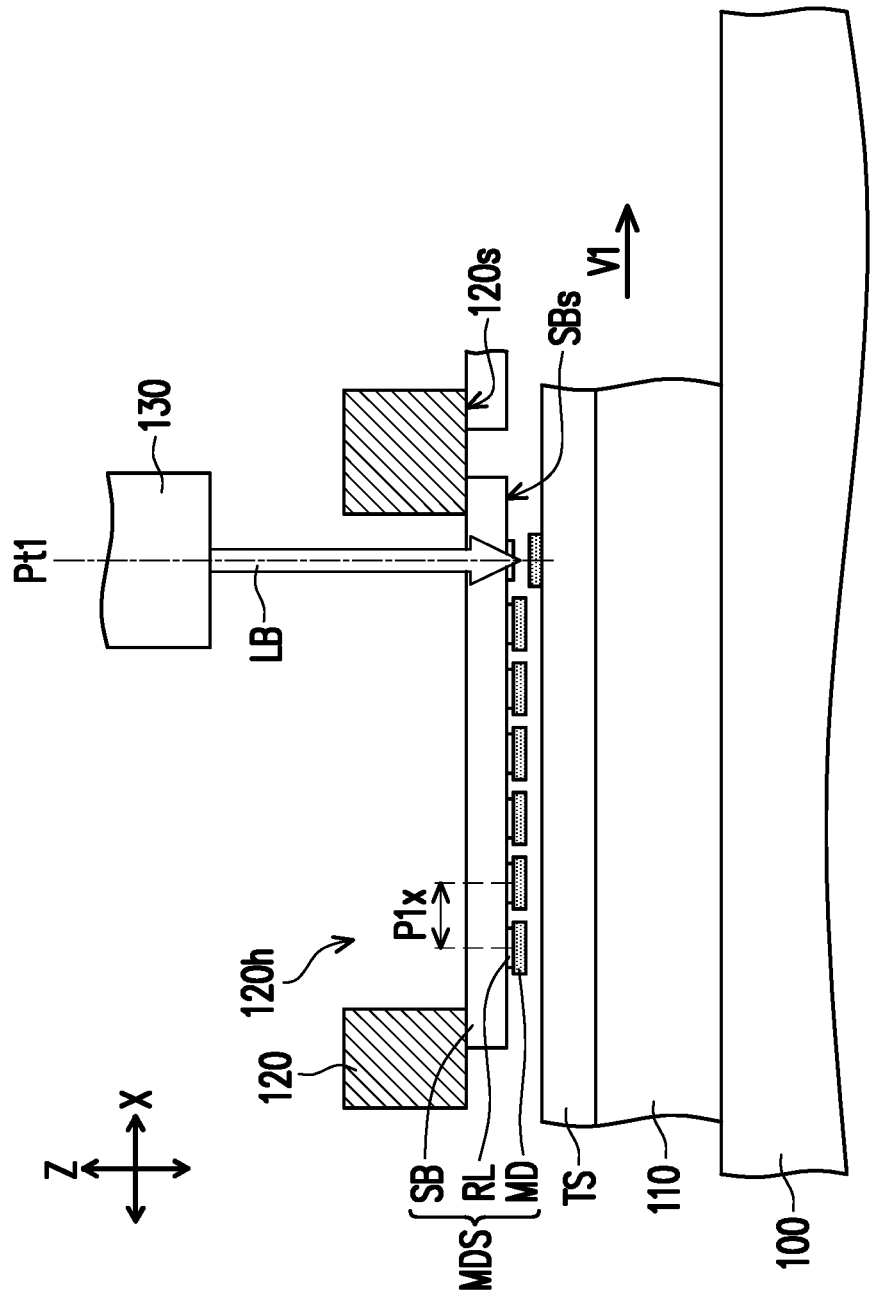
FIG. 2A to FIG. 2G are schematic flowcharts of transposing micro devices using the micro device mass transfer equipment of FIG. 1.

Referring to FIG. 1 and FIG. 2A, a micro device mass transfer equipment 10 includes a base stage 100, a moving stage 110, a substrate stage 120, and a laser device 130. The moving stage 110 is used to carry a target substrate TS and drive the target substrate TS to move relative to the base stage 100. The substrate stage 120 is used to carry a micro device substrate MDS and drive the micro device substrate MDS to move closer to or away from the base stage 100.

In this embodiment, the target substrate TS is, for example, a circuit backplane of a display panel, but not limited thereto. In other embodiments, the target substrate TS may also be a temporary storage substrate formed by stacking a stage plate and an adhesive layer. On the other hand, the micro device substrate MDS includes a substrate SB and multiple micro devices MD disposed on the substrate SB. In this embodiment, the substrate SB of the micro device substrate MDS is, for example, an epitaxial substrate, and the micro device MD may be a micro light-emitting device fabricated on the epitaxial substrate, such as a micro light-emitting diode (Micro LED), but not limited thereto. In other embodiments, the substrate SB of the micro device substrate MDS may also be a temporary stage used in the transfer process (e.g., a glass substrate or a flexible substrate), and the micro device MD may also be an electronic device that performs predetermined electronic functions (e.g., a diode, a transistor, an integrated circuit) or photonic functions (an LED, a laser).

A laser beam LB emitted by the laser device 130 is used to irradiate the corresponding micro device substrate MDS, such that at least one micro device MD to be transposed is detached from the substrate SB and connected to the target substrate TS. More specifically, the micro device mass transfer equipment 10 adopts a laser lift-off (LLO) technique to realize the transfer of the micro device MD. In order to achieve the effect of laser lift-off, there is also a release layer RL between the micro devices MD and the substrate SB. The viscosity of the release layer RL loses effectiveness after the laser beam LB is irradiated, but the disclosure is not limited thereto.

Further, the moving stage 110 is movably disposed on the base stage 100 and is adapted to drive the target substrate TS to move relative to the base stage 100 along at least one direction. The moving stage 110 with a moving path PTH is disposed on the base stage 100. In this embodiment, the direction of the moving path PTH is, for example, a direction parallel to a movement axis X, but not limited thereto. The moving stage 110 may move two-dimensionally along the movement axis X and the movement axis Y, respectively, e.g., along a direction X1 (or the inverse of the direction X1) and a direction Y1 (or a direction Y2). The axial direction of the movement axis X (e.g. the direction X1) intersects the axial direction of the movement axis Y (e.g., the direction Y1 or the direction Y2).

On the other hand, the substrate stage 120 is movably disposed on the base stage 100 and is located on a side of the moving stage 110 away from the base stage 100. The substrate stage 120 is adapted to drive the micro device substrate MDS to move along at least one direction to the moving path PTH of the moving stage 110 and overlap the moving stage 110. For example, in this embodiment, the substrate stage 120 may drive the micro device substrate MDS to move closer to or away from the base stage 100 along a movement axis Z (e.g., the direction Z1 or the direction Z2), or drive the micro device substrate MDS to move to different positions overlapping the moving stage 110 along the movement axis Y (e.g., the direction Y1 or the direction Y2). The axial direction of the movement axis Z, the axial direction of the movement axis X, and the axial direction of the movement axis Y may be selectively perpendicular to one another.

However, the disclosure is not limited to this. In other embodiments, the substrate stage 120 may also move along a movement axis X (e.g., the direction X1 or the inverse of the direction X1). Since the moving stage 110 and the substrate stage 120 may respectively drive the target substrate TS and the micro device substrate MDS to move in different or opposite directions, the alignment speed of the to-be-transposed region on the target substrate TS and the micro devices MD to be transferred on the micro device substrate MDS may be improved.

Figure 2B:
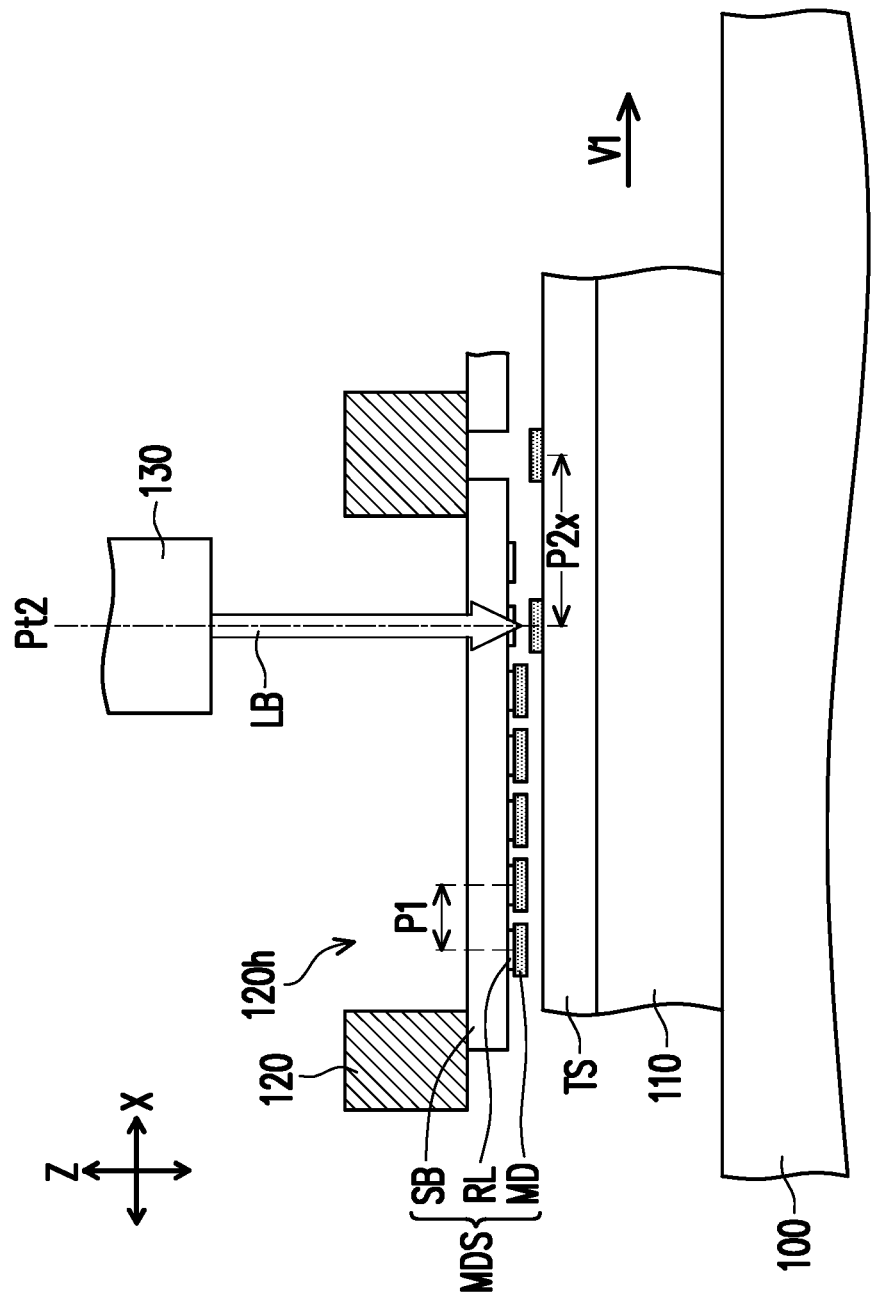

Further, the laser device 130 is disposed on the side of the substrate stage 120 away from the moving stage 110, and is adapted to move to a target position corresponding to the substrate stage 120 (for example, a target position Pt1 in FIG. 2A or a target position Pt2 in FIG. 2B). In this embodiment, the laser device 130 may move two-dimensionally relative to the substrate stage 120 along the movement axis X and the movement axis Y, respectively.

Referring to FIG. 4 at the same time, in this embodiment, the micro device substrate MDS may be selectively disposed on a surface 120s of the substrate stage 120 facing the base stage 100, and the micro device MD thereon is disposed on a surface SBs of the substrate SB facing the target substrate TS. In order for the laser beam LB emitted by the laser device 130 to irradiate the corresponding micro device substrate MDS, and for the micro device MD to be transposed to connect with the target substrate TS, the substrate stage 120 has an opening 120h that is disposed corresponding to the micro device substrate MDS.

For example, in this embodiment, the substrate stage 120 may be used to carry three micro device substrate MDS, which are the first micro device substrate MDS1, the second micro device substrate MDS2, and the third micro device substrate MDS3, respectively. The micro device substrate MDS is, for example, a micro light-emitting device substrate. The micro device substrate MDS is, for example, a micro light-emitting device substrate. Correspondingly, there are also three openings 120h of the substrate stage 120, and the micro device substrates MDS are respectively disposed corresponding to the openings 120h. However, the disclosure is not limited to this. In other embodiments, the number of the openings 120h of the substrate stage and the number of the micro device substrate MDS carried by the substrate stage may be adjusted according to actual process requirements.

It is particularly noted that the width of the micro device substrate MDS in a direction parallel to the surface 120s is slightly larger than the width of the opening 120h of the substrate stage 120 in this direction. For example, the shortest distance between the orthographic profile of the micro device substrate MDS on the surface 120s of the substrate stage 120 and the opening 120h may be 3 mm, and the micro device substrate MDS is adsorbed on the substrate stage 120 through overlapping the edge portion of the substrate stage 120. For example, the substrate stage 120 is disposed on the surface 120s and adjacent to the openings 120h with multiple tiny air holes and adjacent to the exhaust passages connecting these tiny air holes to realize the vacuum adsorption relationship with the micro device substrate MDS, but not limited thereto. In this embodiment, a spacing S of any two adjacent micro device substrates MDS in the arrangement direction, and even the size or shape, may be adjusted according to actual transposition requirements, which is not limited in the disclosure.

On the other hand, the emission color of the micro light-emitting device (i.e., the micro device MD) of any one of these micro device substrates MDS is different from the emission color of the micro light-emitting device (i.e., the micro device MD) of another of these micro device substrates MDS. For example, the emission colors of the respective micro light-emitting devices of the first micro device substrate MDS1, the second micro device substrate MDS2, and the third micro device substrate MDS3 are red, green, and blue, respectively, but not limited thereto.

In order to increase the alignment accuracy between the target substrate TS, the micro device substrate MDS, and the laser device 130, a servo motor module 140 is included on the movable stage and the bracket that carry these components. That is, the servo motor module 140 may be used to drive the moving stage 110, the substrate stage 120, and the laser device 130 to move along their respective movement axes. For example, in this embodiment, the servo motor module 140 may include a servo motor 141A and a servo motor 141B disposed between the moving stage 110 and the base stage 100, multiple servo motors 142A disposed between multiple support columns 102 and multiple beams 104, multiple servo motors 142B disposed between the beams 104 and the substrate stage 120, multiple servo motors 143A disposed between the beams 104 and a gantry mechanism 106, and a servo motor 143B disposed between the gantry mechanism 106 and a supporting arm 108, but not limited thereto.

In this embodiment, four support columns 102 and two beams 104 may form a gantry type moving mechanism of the base stage 100, and the substrate stage 120 and the laser device 130 are movably mounted on the gantry type moving mechanism of the base stage 100. Specifically, the laser device 130 may be mounted on the gantry mechanism 106 via the supporting arm 108. However, the disclosure is not limited thereto. In other embodiments, the relative movement relationship among the moving stage 110, the substrate stage 120, and the laser device 130 may also be realized by adopting any movable support structure design known to those skilled in the art to which the disclosure pertains.

In detail, the servo motor 141A and the servo motor 141B may drive the moving stage 110 to move relative to the base stage 100 along the movement axis X and the movement axis Y, respectively. The servo motors 142A may drive the substrate stage 120 and the laser device 130 to move along the movement axis Z to move closer to or move away from the base stage 100. The servo motors 142B may drive the substrate stage 120 to move along the movement axis Y. The servo motor 143A and the servo motor 143B may drive the laser device 130 to move relative to the substrate stage 120 along the movement axis X and the movement axis Y, respectively.

It should be noted that, in the present embodiment, the number of the laser devices 130 is set as an example for illustrative description, which does not mean that the disclosure is limited thereto. In other embodiments, the number of laser devices 130 that are disposed may also be adjusted according to the number of micro device substrates MDS that are disposed, for example, three laser devices 130 are respectively disposed corresponding to three micro device substrates MDS, and the three laser devices 130 may be respectively moved to the target positions of the corresponding micro device substrates MDS.

In this embodiment, in addition to a transfer station TFS formed by the combination of the moving stage 110, the substrate stage 120, the laser device 130, and the movable gantry support, the micro device mass transfer equipment 10 also includes a rolling and pressing mechanism 200 disposed on the base stage 100 and located on the moving path of the moving stage 110. It is particularly noted that the rolling and pressing mechanism 200 is independent from the transfer station TFS and serves as the thermal bonding station TBS of the micro device mass transfer equipment 10. That is, the transfer process and the bonding process of the micro device MD are performed separately. Therefore, during the process of transferring the micro devices MD on the micro device substrate MDS to the target substrate TS by the transfer mechanism TFS, the thermocompression bonding process is not performed at the same time. Instead, the micro devices MD are transferred to the rolling and pressing mechanism 200 for the bonding process under the driving of the moving stage 110 after the required micro devices MD are all transferred to the target substrate TS.

Figure 2C:
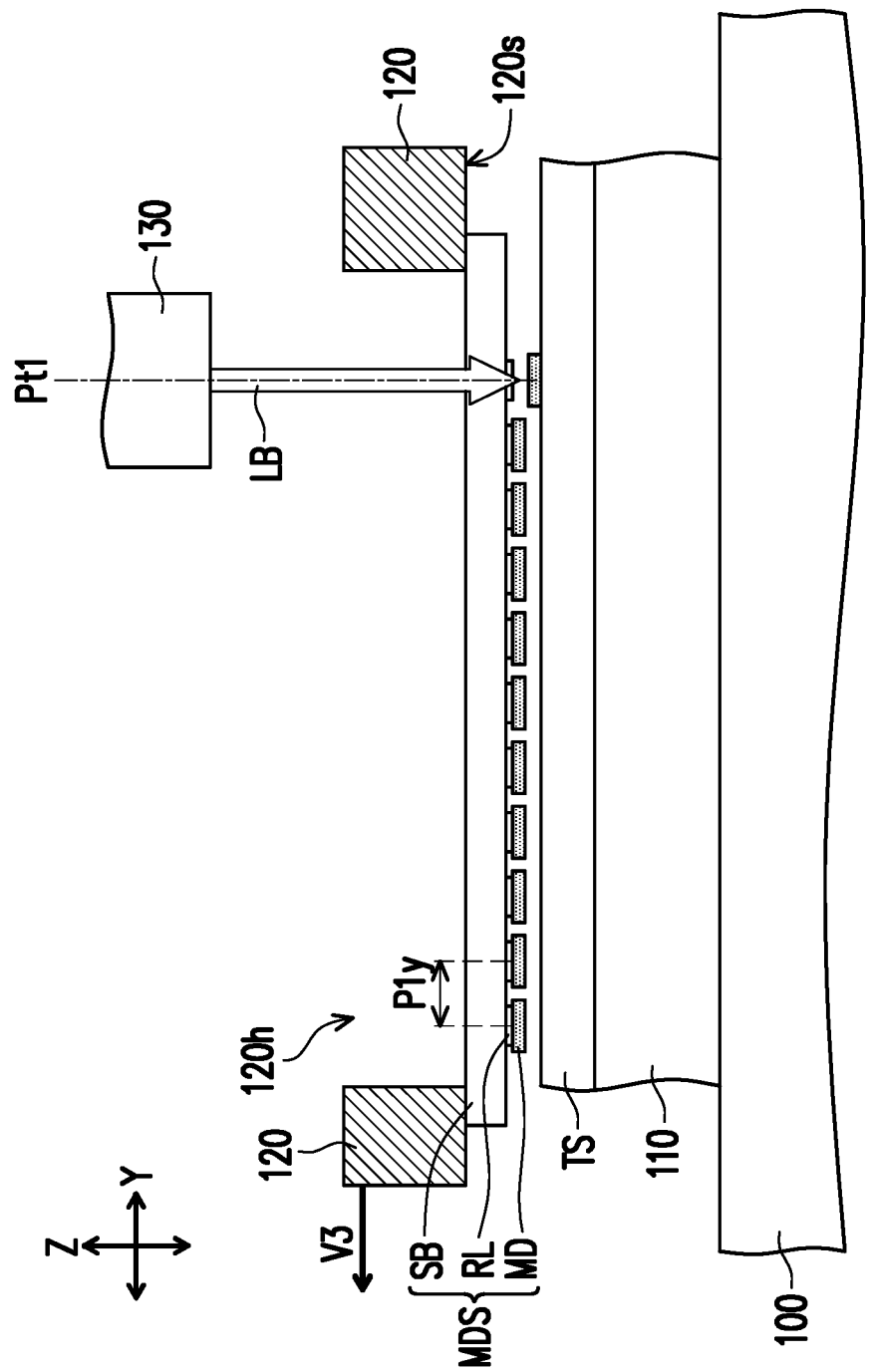
Figure 2D:
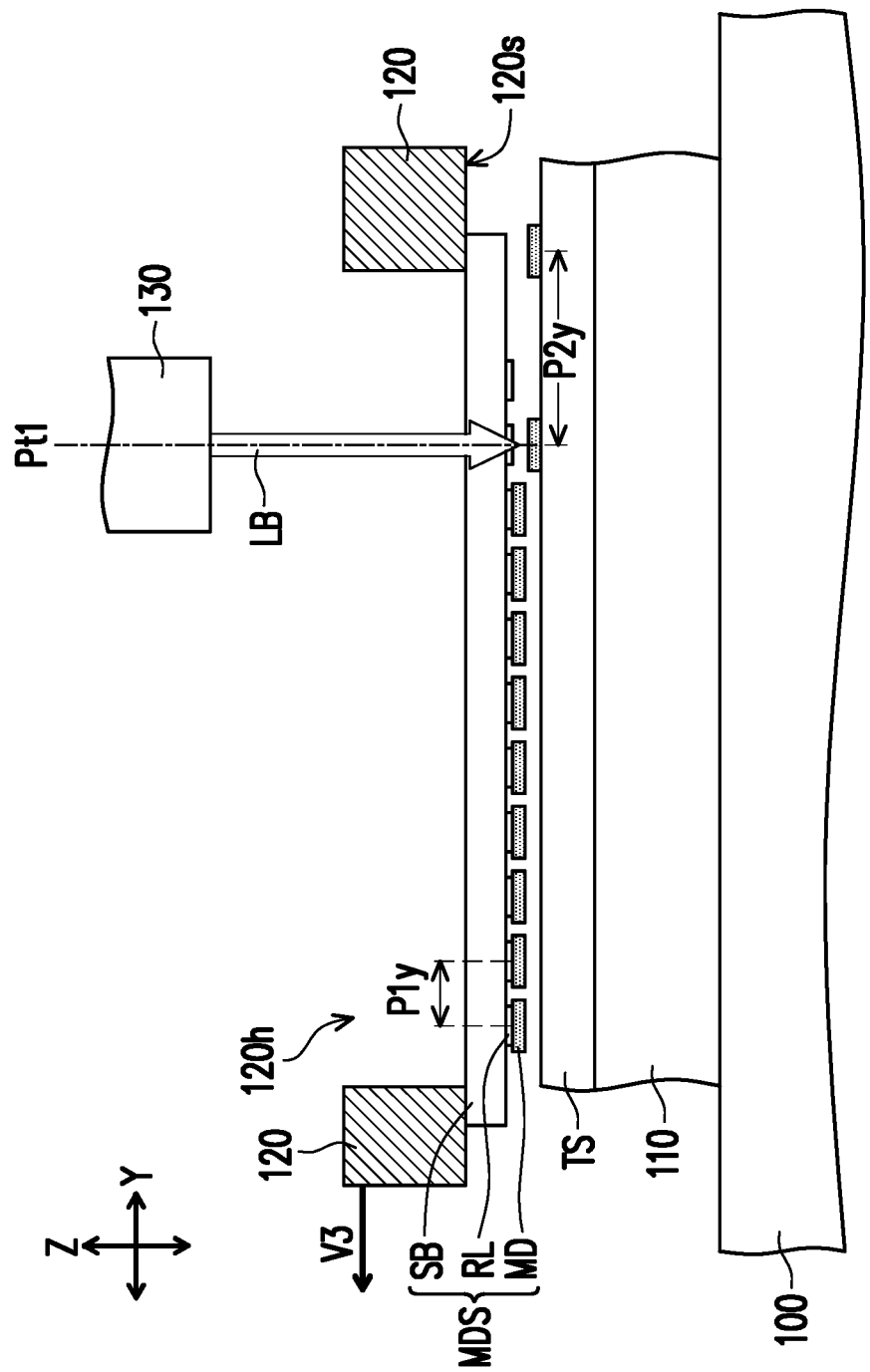
Figure 2E:
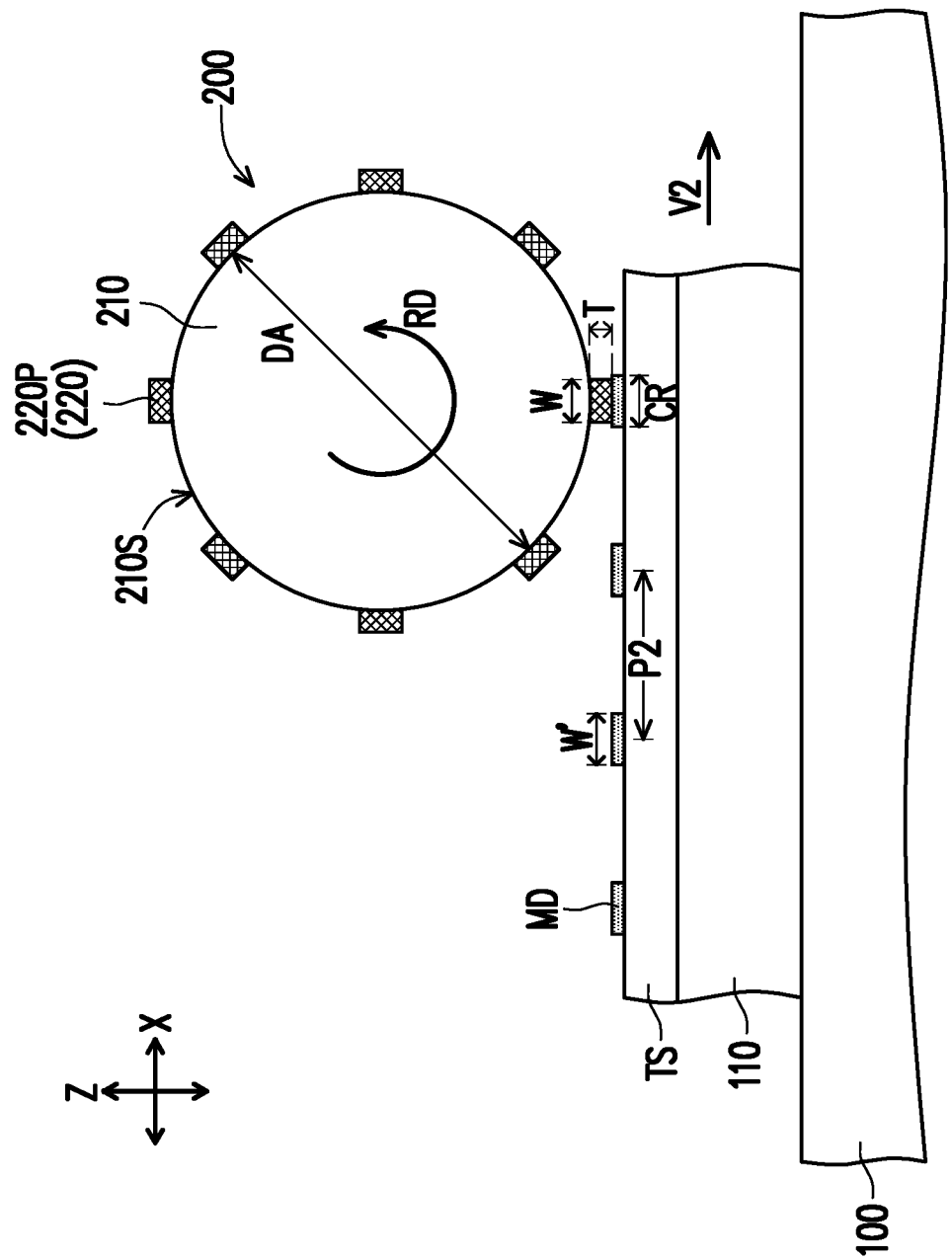

When the moving stage 110 carrying the target substrate TS passes through the rolling and pressing mechanism 200, a contact region CR is formed between the moving stage 110 (or the target substrate TS) and the rolling and pressing mechanism 200, and the rolling and pressing mechanism 200 is adapted to roll and press the micro device MD that passes through within the contact region CR (shown in FIG. 2E). At the same time, the contact region CR is adapted to be heated to bond the micro device MD with the target substrate TS. In the present embodiment, the heating step of the contact region CR may be implemented by heating the rolling and pressing mechanism 200. That is, the rolling and pressing mechanism 200 may include a heating device and serve as a heating mechanism at the same time, but not limited thereto. The micro devices MD are firmly bonded to the target substrate TS after being heated and rolled by the rolling and pressing mechanism 200.

The following exemplarily describes a method of fabricating a micro device panel adapted for the micro device mass transfer equipment 10. Referring to FIG. 1 and FIG. 2A, after the target substrate TS and the micro device substrate MDS are respectively disposed on the moving stage 110 and the substrate stage 120, the transfer process of the micro device MD is started. The moving stage 110 is moved to a predetermined position on the base stage 100, such that at least one micro device substrate MDS on the substrate stage 120 overlaps the target substrate TS on the moving stage 110 in the axial direction of the movement axis Z. During the process, the moving stage 110, for example, moves toward the direction X1, and the substrate stage 120, for example, moves toward the direction Z2, to move closer to the target substrate TS, but not limited thereto.

It should be noted that, during the moving process of the moving stage 110 and the substrate stage 120, the laser device 130 may move to the target position Pt1 corresponding to the substrate stage 120 along the movement axis X and the movement axis Y at the same time, so as to shorten the process time required for the alignment step among the moving stage 110, the substrate stage 120, and the laser device 130. It should be understood that the sequence or synchronization of the alignment step of the laser device 130 and the substrate stage 120 and the alignment step of the moving stage 110 and the substrate stage 120 may be adjusted according to different process requirements, which is not limited by the disclosure.

After receiving the feedback signal from the servo motor module 140 and confirming that everything is correct, a laser beam LB is emitted from the laser device 130. The laser beam LB is irradiated on the release layer RL connecting the micro device MD to be transposed and the substrate SB through the opening 120h of the substrate stage 120, to reduce the adhesion between the micro device MD to be transposed and the substrate SB. The release layer RL herein is, for example, a laser debonding layer, but not limited thereto.

Referring to FIG. 2B and FIG. 3 at the same time, for example, during the irradiation process of the laser beam LB, the laser device 130 may rapidly irradiate an entire row of micro devices MD along the movement axis Y, such that the entire row of micro devices MD are transferred onto the target substrate TS at approximately the same time. After finishing the irradiation of one row of micro devices MD (e.g., the entire row of micro devices MD located at the target position Pt1 in FIG. 2A), the next row of micro devices MD (e.g., the entire row of micro devices MD located at the target position Pt2 in FIG. 2B) is moved along the movement axis X and the same type of scanning irradiation is performed, and so on. In other words, when the moving stage 110 moves along the movement axis X (e.g., the direction X1 of FIG. 1), the laser beam LB simultaneously moves along the movement axis Y (e.g., the direction Y1 and the direction Y2 of FIG. 1) at a faster speed.

In this embodiment, the micro devices MD are arranged on the micro device substrate MDS with a first pitch P1x along the moving direction of the target substrate TS (e.g., the axial direction of the movement axis X). After being detached from the substrate SB and transferred to the target substrate TS, the micro devices MD may be disposed on the target substrate TS with a second pitch P2x along the moving direction of the target substrate TS, and the second pitch P2x is greater than the first pitch P1x. Specifically, the second pitch P2x of the micro devices MD on the target substrate TS may be adjusted by changing the moving speed of the moving stage 110.

It should be noted that, in this embodiment, when the laser beam LB moves along an axial direction of the movement axis Y (e.g., the direction Y1 in FIG. 1), the substrate stage 120 may also move along the axial direction of the movement axis Y, as shown in FIG. 2C and FIG. 2D. More specifically, during the process of rapidly moving the laser beam LB along the movement axis Y and irradiating an entire row of micro devices MD, the moving speed (e.g., a third speed V3) of the substrate stage 120 along the movement axis Y may be changed to adjust the arrangement pitch of the micro devices MD on the target substrate TS. For example, in this embodiment, the micro devices MD are arranged on the micro device substrate MDS with a first pitch Ply in the axial direction of the movement axis Y. After being detached from the substrate SB and transferred to the target substrate TS, the micro devices MD are arranged on the target substrate TS with a second pitch P2y in the axial direction of the movement axis Y, and the second pitch P2y is greater than the first pitch from P1y.

Figure 2F:
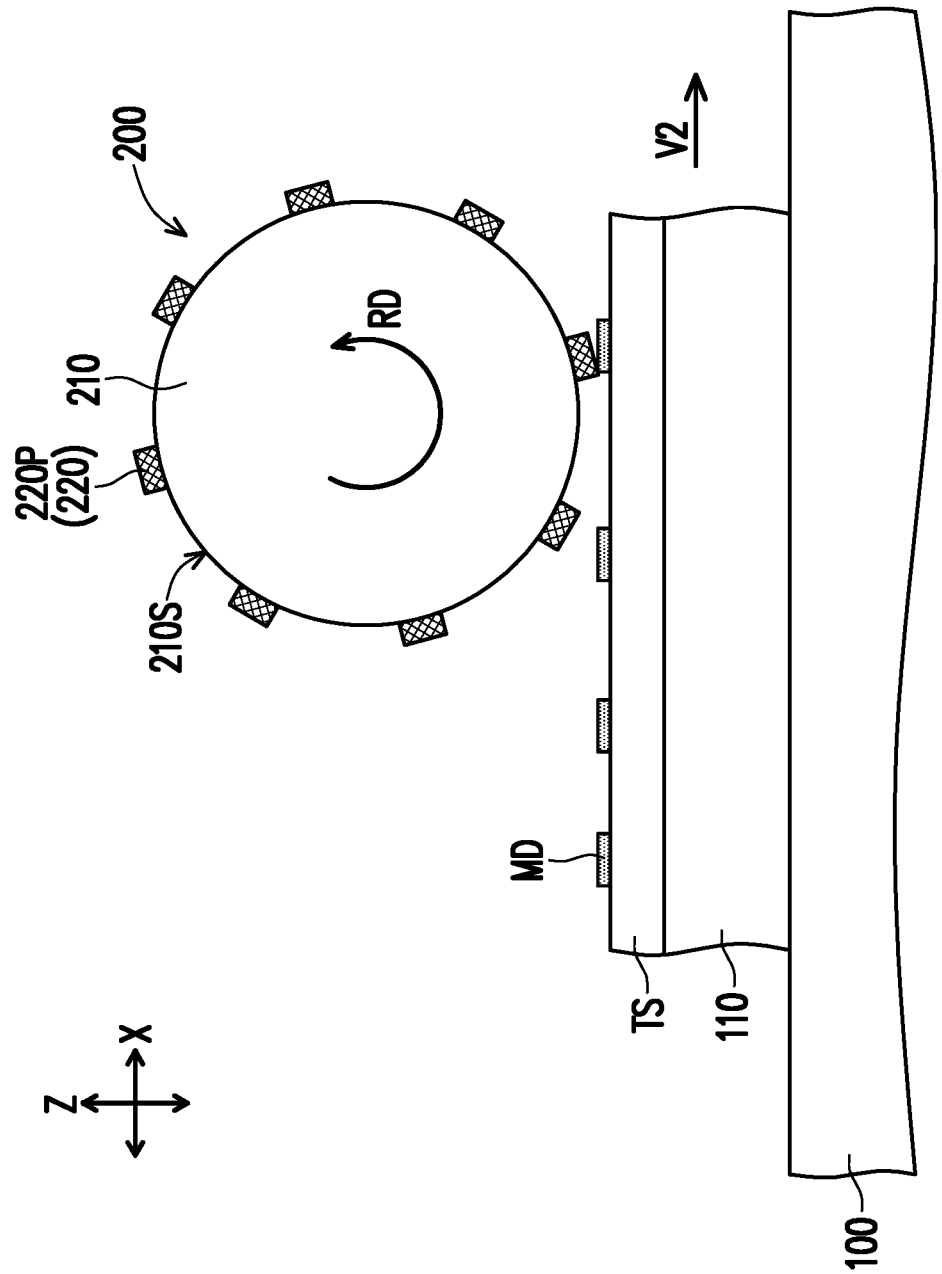
Figure 2G:
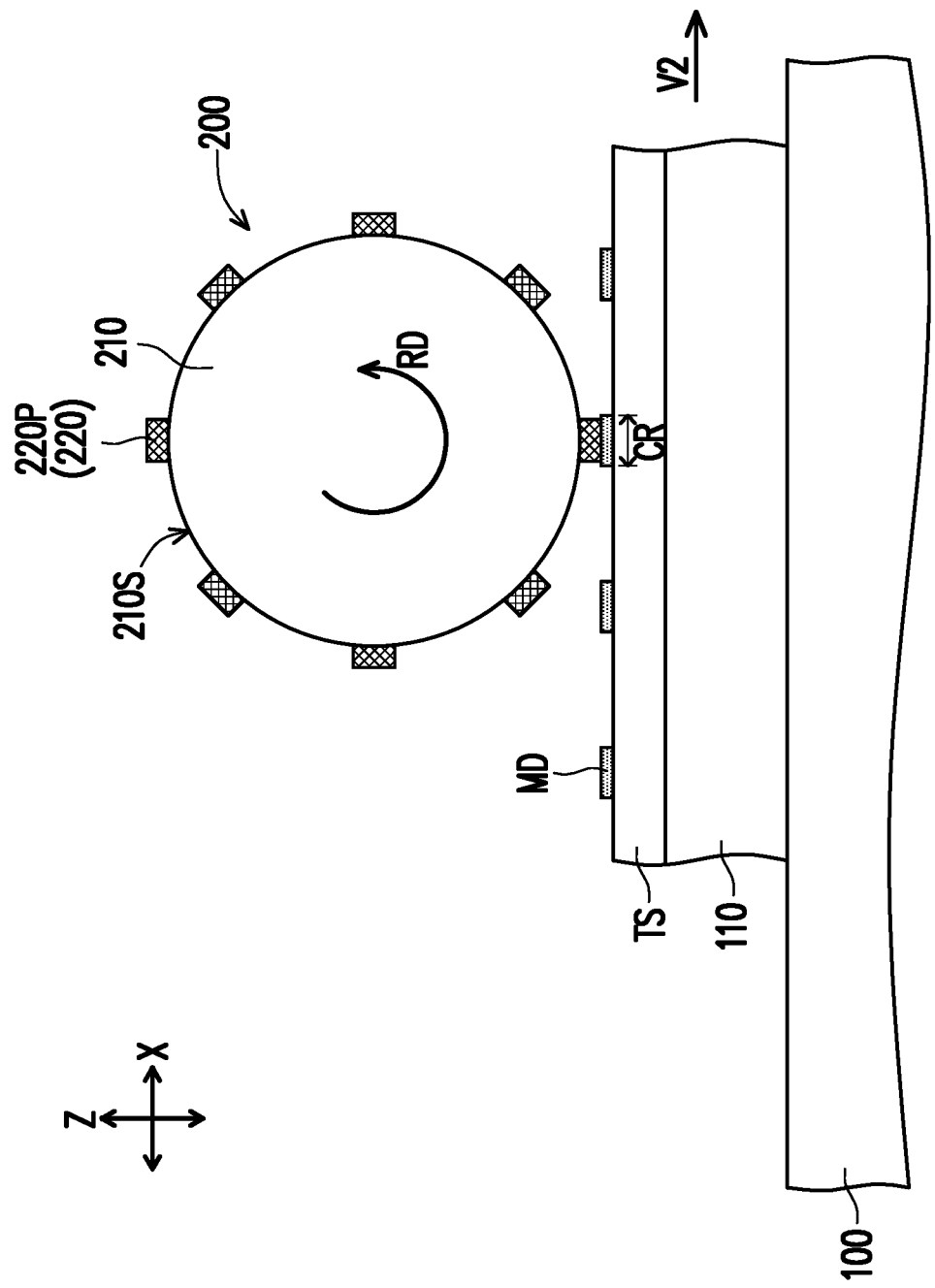

After the transfer step of the micro devices MD is completed, the moving stage 110 is moved to another predetermined position on the base stage 100, such that the target substrate TS that has the micro devices MD overlaps the rolling and pressing mechanism 200 in the axial direction of the movement axis Z. As shown in FIG. 2E to FIG. 2G, when the target substrate TS passes through the rolling and pressing mechanism 200, the rolling and pressing mechanism 200 rolls and presses the micro device MD passing directly below it, and forms a contact region CR. At the same time of the rolling and pressing, the contact region CR is heated, such that the rolled and pressed micro device MD is electrically bonded to the target substrate TS.

The rolling and pressing mechanism 200 may include a roller 210 and a buffer layer 220, in which the buffer layer 220 is disposed on the wheel surface of the roller 210. During the process of rolling and pressing the micro device MD by the rolling and pressing mechanism 200, the buffer layer 220 is located between the micro device MD and the roller 210 and is in contact with the micro device MD. During the rolling and pressing process, the excessive down force exerted on the micro device MD may be adsorbed through the buffer layer 220 to avoid damage to the micro device. In this embodiment, the buffer layer 220 may be multiple buffer bumps 220P separated from one another. These buffer bumps 220P are dispersedly disposed on a circumferential surface 210S (or wheel surface) of the roller 210, and the arrangement pitch along the circumferential direction of the roller 210 may depend on the arrangement pitch (e.g., the second pitch P2x) on the moving direction of the micro devices MD on the target substrate TS. However, the disclosure is not limited thereto. In other embodiments, the buffer layer 220A of a rolling and pressing mechanism 200A may also cover the entire surface 210S of the roller 210 (as shown in FIG. 5).

It should be noted that, although the roller 210 in FIG. 2E to FIG. 2G rotates in a counterclockwise rotation direction RD, it does not mean that the disclosure is limited by the contents disclosed in the drawings. In other not-shown embodiments, the rotation direction of the roller 210 may be adjusted according to the moving direction of the moving stage 110.

In this embodiment, the roller 210 of the rolling and pressing mechanism 200 may be thermally coupled to a heating source (not shown). While being rolled and pressed by the roller 210, the micro device MD may also generate a more stable electrical connection relationship with the target substrate TS through the heating of the buffer bump 220P and the roller 210. That is, in this embodiment, the heating step of the contact region CR may be implemented by heating the roller 210, but not limited thereto. In another embodiment, the step of heating the contact region CR may also be using another laser light source 135 to irradiate the contact region CR, in which the laser light source 135 is disposed in the base stage 100 and is located on a side of the moving stage 110A facing away from the rolling and pressing mechanism 200 (as shown in FIG. 6), and the laser light source 135 is used to, facing the contact region CR, emit a laser beam LB". In the embodiment of FIG. 6, the light transmittance of the moving stage 110A to the laser beam LB" is preferably greater than 90%.

In yet another embodiment, multiple heating units 250 (i.e., heating mechanisms) may be dispersedly disposed on the circumferential surface 210S of the roller 210 of the rolling and pressing mechanism 200B. The heating units 250 are respectively disposed corresponding to the buffer bumps 220P. Different from the embodiment of FIG. 2E, which heats the entire roller 210, the heating units 250 in FIG. 7 only heat the corresponding contact regions CR, which may further improve the local heating effect of the roller 210.

In this embodiment, the roller 210 of the rolling and pressing mechanism 200 may have a circular diameter DA (as shown in FIG. 2E), and the buffer bump 220P has a width W along the circumferential direction of the roller 210 and a thickness T along the radial direction of the roller 210. The circular diameter DA is preferably between 1 cm and 50 cm. The ratio of the circular diameter DA to the width W is preferably between 104 and 105, and the width W is preferably less than a width W' of the micro device MD.

Accordingly, the rolling and pressing mechanism 200 may only contact a single micro device MD wherever possible during the rolling process, to avoid the heating step during the rolling and pressing process from affecting the operational and electrical properties or the bonded state of the already-bonded micro devices MD outside the contact region CR. That is to say, the rolling and pressing mechanism 200 of the present embodiment may simultaneously generate the effect of local heating during the rolling and pressing process of the micro device MD, which facilitates in the improvement of the bonding yield of the micro device MD. If the ratio of the circular diameter DA of the roller 210 to the width W of the buffer bump 220P is too large, the accuracy of the rolling and pressing mechanism 200 in pressing the micro device MD in the contact region CR decreases.

From another viewpoint, the roller 210 may have a roundness, and the roundness is defined by, for example, the difference between the maximum radius and the minimum radius of the roller 210. For example, when the difference is smaller, the surface flatness of the roller 210 is flatter, and vice versa. In order to meet the flatness requirement of the bonding process, the roundness of the roller 210 cannot be greater than 1 micron. Preferably, the roundness is less than 0.5 microns.

Different from the traditionally adopted roll-to-roll process to simultaneously transfer and bond the micro devices, the method of fabricating the micro device panel of the disclosure is to carry out the transfer process and the bonding process of the micro devices MD in stages. Therefore, in addition to a better bonding yield, the transfer accuracy of the micro device MD may be improved.

On the other hand, in the transfer process of the micro device MD, the moving stage 110 may move at a first speed V1. In the thermocompression bonding process of the micro device MD, the moving stage 110 may move at a second speed V2, and the first speed V1 may be greater than or equal to the second speed V2. Through the adjustment of the first speed V1 and the second speed V2, the continuity of the transfer process and the bonding process of the micro device MD may be increased, which facilitates in the adjustment of the overall production capacity.

Although not shown in the drawings, in this embodiment, the transfer process and bonding process may be repeated to electrically bond the micro devices MD on different micro device substrates MDS (e.g., the first micro device substrate MDS1, the second micro device substrate MDS2, and the third micro device substrate MDS3 in FIG. 4) to the same target substrate TS, respectively, thus completing the fabrication of the micro device panel.

Other embodiments are described below to explain the disclosure in detail, and the same components will be denoted by the same reference numerals, and the description of the same technical content will be omitted. For the description of the omitted part, reference may be made to the above embodiment, and details are not described in the following embodiments.

Figure 8:
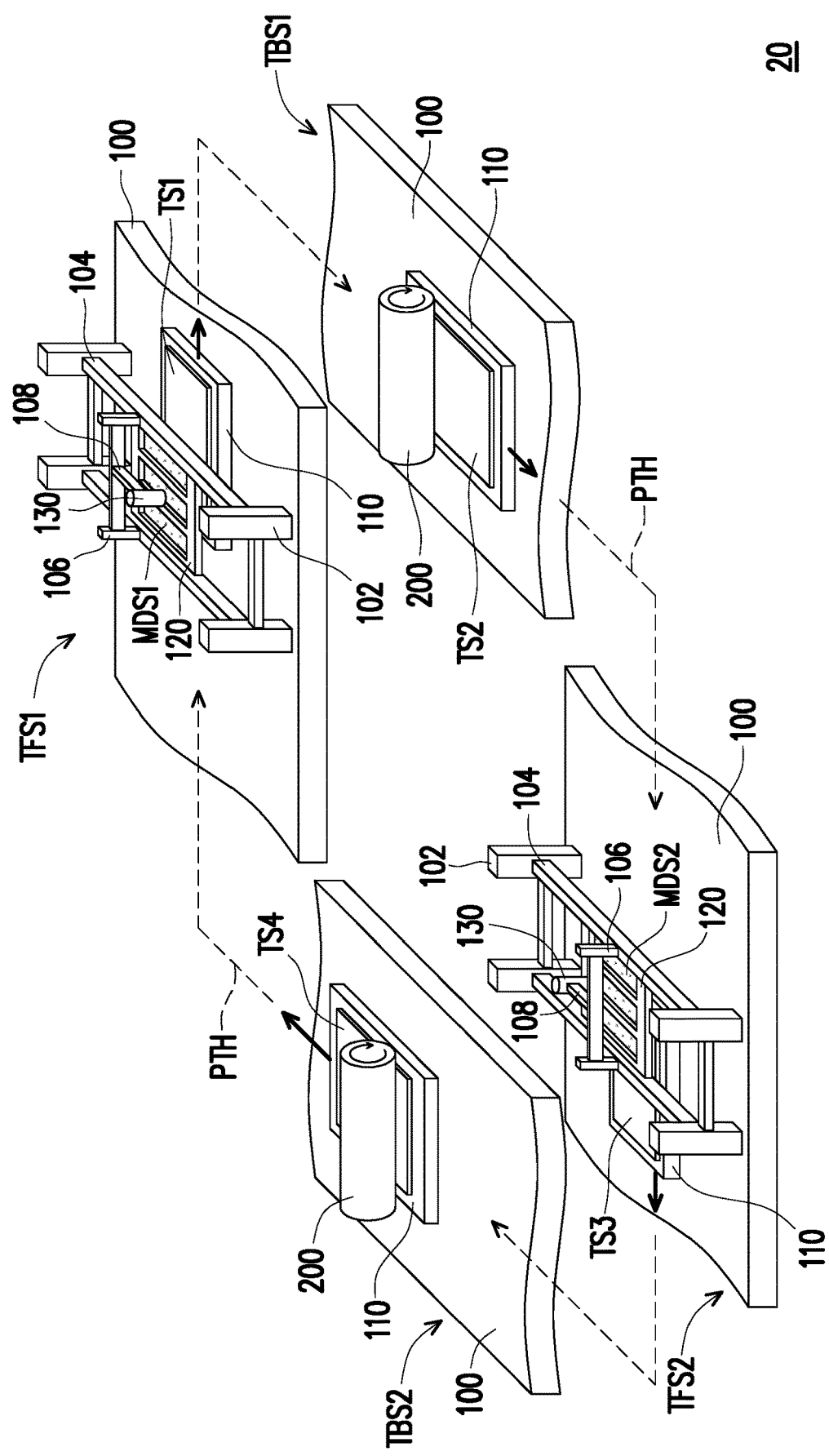
FIG. 8 and FIG. 9 are schematic diagrams of a micro device mass transfer equipment according to a second embodiment of the disclosure.
Figure 9:
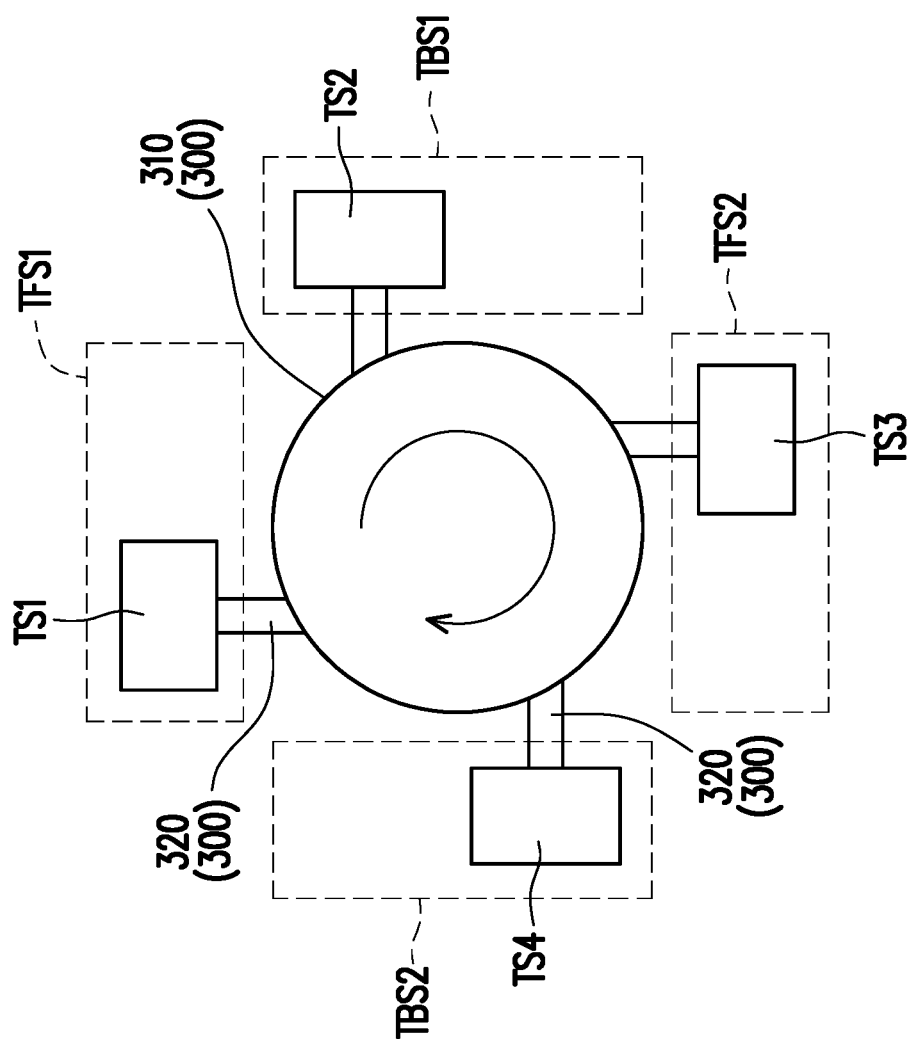

FIG. 8 and FIG. 9 are schematic diagrams of a micro device mass transfer equipment according to a second embodiment of the disclosure. Referring to FIG. 8, in this embodiment, the micro device mass transfer equipment 20 may include multiple base stages 100, multiple substrate stages 120, and multiple rolling and pressing mechanisms 200. Each of the base stages 100 has a substrate stage 120 or a rolling and pressing mechanism 200, in which a moving path PTH of the moving stage 110 extends between the base stages 100. For example, the micro device mass transfer equipment 20 may include two groups of transfer stations TFS and thermal bonding stations TBS as shown in FIG. 1, such as a first transfer station TFS1, a second transfer station TFS2, a first thermal bonding station TBS1, and a second thermal bonding station TBS2. These process stations may simultaneously process different target substrates, such as a first target substrate TS1, a second target substrate TS2, a third target substrate TS3, and a fourth target substrate TS4.

For example, in a first time interval, the first transfer station TFS1 may transfer the micro devices on the first micro device substrate MDS1 to the first target substrate TS1, and the second transfer station TFS2 may transfer the micro devices on the second micro device substrate MDS2 to the third target substrate TS3, the first thermal bonding station TBS1 may thermally bond the micro devices on the second target substrate TS2 with the second target substrate TS2, and the second thermal bonding station TBS2 may thermally bond the micro devices on the fourth target substrate TS4 with the fourth target substrate TS4.

After the process of each of the stations is completed, the target substrate in each of the process stations may be transferred to the next process station (as shown in the moving path PTH in FIG. 8). For example, the first target substrate TS1 in the first transfer station TFS1 may be transferred to the first thermal bonding station TBS1, the second target substrate TS2 in the first thermal bonding station TBS1 may be transferred to the second transfer station TFS2, the third target substrate TS3 in the second transfer station TFS2 may be transferred to the second thermal bonding station TBS2, and the fourth target substrate TS4 in the second thermal bonding station TBS2 may be transferred to the first transfer station TFS1.

After the transfer is completed, each of the process stations may perform a corresponding process (i.e., a transfer process or a thermal bonding process) on the target substrate transferred from the previous process station within a second time interval. For example, in this embodiment, the target substrate may be sequentially subjected to the transfer process of the first micro light-emitting device with the first emission color at the first transfer station TFS1, the thermal bonding process of the first micro light-emitting device at the first thermal bonding station TBS1, the transfer process of the second micro light-emitting device with the second emission color at the second transfer station TFS2, and the thermal bonding process of the second micro light-emitting device at the second thermal bonding station TBS2.

Since the transfer process of the first transfer station TFS1 and the second transfer station TFS2 is similar to the transfer process of FIG. 2A and FIG. 2B, and the bonding process of the first thermal bonding station TBS1 and the second thermal bonding station TBS2 is similar to the bonding process in FIG. 2E to FIG. 2G, please refer to the relevant paragraphs of the foregoing embodiments for the detailed descriptions, which is not repeated here.

Referring to FIG. 9 at the same time, in this embodiment, the micro device mass transfer equipment 20 may further include a transposition mechanism 300, which is adapted to transfer the target substrates of different process stations to the next process station. For example, the transposition mechanism 300 may include a rotation mechanism 310 and multiple pick-up members 320. The pick-up members 320 may be respectively disposed at multiple positions of the rotation mechanism 310 corresponding to different process stations to facilitate picking up corresponding target substrates. Disposing the aforementioned four process stations around the transposition mechanism 300 may not only reduce the configuration space required by the micro device mass transfer equipment 20, but also shorten the transfer time of the target substrate between these process stations, which facilitates in the improvement of the overall production capacity.

It should be noted that, in other embodiments, the number of transfer stations and thermal bonding stations may be adjusted according to actual production capacity requirements or product design, and the disclosure is not limited by the contents disclosed in the drawings.

To sum up, in the micro device mass transfer equipment and the method of fabricating the micro device panel according to an embodiment of the disclosure, after the micro devices are transferred to the target substrate, the micro devices further need to be rolled by the rolling and pressing mechanism, and the micro devices may be firmly bonded to the target substrate after the contact region of the micro devices with the rolling and pressing mechanism has been heated. Since the transfer process and bonding process of micro devices are carried out in stages, in addition to improving the smoothness of the transfer process and bonding process of micro devices, it may also prevent the bonded micro devices from being damaged by the influence of unexpected heat flow during the bonding process of other micro devices.

What is claimed is:
1. A micro device mass transfer equipment, comprising:
a base stage;

a moving stage, movably disposed on the base stage and moving with a moving path;

a substrate stage, movably disposed on the base stage and adapted to move between different positions overlapping the moving stage;

a laser device, movably disposed on the base stage, wherein the laser device is adapted to move relative to the substrate stage and emits a laser beam toward the substrate stage;

a rolling and pressing mechanism, disposed on the moving path of the moving stage and forming a contact region with the moving stage; and a heating mechanism, disposed corresponding to the contact region and adapted to heat the contact region between the moving stage and the rolling and pressing mechanism.

2. The micro device mass transfer equipment according to claim 1, wherein the moving stage is adapted to move along a first direction or a second direction, parallel to the base stage, the substrate stage is adapted to move along the second direction or a third direction, and the first direction, the second direction, and the third direction are perpendicular to one another.

3. The micro device mass transfer equipment according to claim 2, wherein while the moving stage moves along the first direction, the laser beam moves along the second direction.

4. The micro device mass transfer equipment according to claim 3, wherein while the laser beam moves along the second direction, the substrate stage moves along the second direction.

5. The micro device mass transfer equipment according to claim 1, wherein the moving stage is adapted to pass through the substrate stage at a first speed, and is adapted to pass through the rolling and pressing mechanism at a second speed, wherein the first speed is greater than or equal to the second speed.

6. The micro device mass transfer equipment according to claim 1, wherein the rolling and pressing mechanism comprises a roller.

7. The micro device mass transfer equipment according to claim 6, wherein the rolling and pressing mechanism further comprises a buffer layer disposed on the roller.

8. The micro device mass transfer equipment according to claim 7, wherein the buffer layer is a plurality of buffer bumps separated from one another.

9. The micro device mass transfer equipment according to claim 8, wherein the roller has a roundness, each of the buffer bumps has a thickness, and the roundness is less than the thickness.

10. The micro device mass transfer equipment according to claim 1, wherein the heating mechanism comprises:

a laser light source, disposed in the base stage and located on a side of the moving stage facing away from the rolling and pressing mechanism, and adapted to irradiate the contact region with another laser beam to heat the contact region, wherein a light transmittance of the moving stage to the another laser beam is greater than 90%.

11. The micro device mass transfer equipment according to claim 1, further comprising a plurality of the base stages, a plurality of the substrate stages, and a plurality of the rolling and pressing mechanisms, each of the base stages is provided with one of the substrate stages or one of the rolling and pressing mechanisms, wherein the moving path of the moving stage extends between the base stages.

12. The micro device mass transfer equipment according to claim 1, wherein the heating mechanism comprises a plurality of heating units, and the heating units are dispersedly disposed on a circumferential surface of the rolling and pressing mechanism.

* * * * *